United States Patent
Noguchi et al.

(10) Patent No.: US 7,436,051 B2
(45) Date of Patent: *Oct. 14, 2008

(54) COMPONENT FOR FABRICATING AN ELECTRONIC DEVICE AND METHOD OF FABRICATING AN ELECTRONIC DEVICE

(75) Inventors: Takao Noguchi, Tokyo (JP); Hisatoshi Saito, Tokyo (JP)

(73) Assignee: TDK Corporation (JP)

( * ) Notice: Subject to any disclaimer, the term of this patent is extended or adjusted under 35 U.S.C. 154(b) by 270 days.

This patent is subject to a terminal disclaimer.

(21) Appl. No.: 11/028,891

(22) Filed: Jan. 3, 2005

(65) Prior Publication Data

US 2005/0191792 A1    Sep. 1, 2005

(30) Foreign Application Priority Data

Jan. 9, 2004    (JP) .............................. 2004-003586

(51) Int. Cl.
H01L 23/02    (2006.01)

(52) U.S. Cl. ...................................... 257/678; 438/106

(58) Field of Classification Search ................. 257/678, 257/753, 783–786; 438/106, 418, 419
See application file for complete search history.

(56) References Cited

U.S. PATENT DOCUMENTS 7,042,090 B2 *   5/2006   Noguchi et al. ............. 257/753
7,080,446 B2 *   7/2006   Baba et al. ..................... 29/832
2001/0041261 A1 * 11/2001  Tozuka et al. ............... 428/349
2002/0102791 A1   8/2002   Kurasawa et al.

FOREIGN PATENT DOCUMENTS

| JP | 10-134634 | | 4/1998 |
| JP | 2003204167 A | * | 7/2003 |
| JP | 2004363118 A | * | 12/2004 |

OTHER PUBLICATIONS

Office Action dated Jul. 20, 2007, in the corresponding Chinese Application (6pgs).

* cited by examiner

*Primary Examiner*—Jerome Jackson
*Assistant Examiner*—Jami M Valentine
(74) *Attorney, Agent, or Firm*—Young Law Firm, P.C.

(57) ABSTRACT

A component for fabricating the electronic device comprises a substrate and a conductive film provided on the substrate, in which the adhesion of the conductive film to the substrate is not greater than 0.1 N/cm. The adhesion of the conductive film to the substrate is weak enough to enable the conductive film to be readily peeled from the substrate. This makes it possible to form a component on a substrate other than the substrate used during film formation, thereby greatly increasing the degree of product configuration freedom. If the adhesion of a lower conductive film on the substrate side is made to be not greater than 0.04 N/cm, it becomes very easy to peel the conductive film from the substrate.

4 Claims, 6 Drawing Sheets

COMPONENT FOR FABRICATING AN ELECTRONIC DEVICE AND METHOD OF FABRICATING AN ELECTRONIC DEVICE

TECHNICAL FIELD

The present invention relates to a component for fabricating an electronic device and a method of fabricating the electronic device, and particularly to a component that includes a ferroelectric or piezoelectric functional film and an electrically conductive film provided in the vicinity thereof such as a film capacitors, ferroelectric nonvolatile memories, or film bulk acoustic wave resonators and the like, and to a method of fabricating the electronic device.

BACKGROUND OF THE INVENTION

Functional films composed of ferroelectric material or piezoelectric material are used in some electronic devices such as film capacitors, ferroelectric nonvolatile memories, film bulk acoustic wave resonators and the like. A film bulk acoustic wave resonator, for instance, is configured by sandwiching a functional film made of a piezoelectric material between an upper conductive film and a lower conductive film. The film bulk acoustic wave resonator operates as a high-frequency filter when a high-frequency signal is applied across the two conductors.

In order to achieve good device characteristics in such an electronic device, it is necessary to enhance the crystallinity of the functional film. In order to enhance it, it is important not only to optimize the functional film-forming method and conditions but also to improve the crystallinity of the lower conductive film serving as the base for the functional film. This is because the crystallinity of the lower conductive film serving as the base markedly affects the crystallinity of the functional film. A method of forming a lower conductive film with good crystallinity is taught by, for example, Japanese Patent Application Laid Open No. 11-312801.

The material of the lower conductive film needs to be one having high lattice matching and low reactivity with respect to the functional film formed thereon. When, for example, ZnO or some other such piezoelectric material of wurtzite crystal structure is used as the functional film material, therefore, the lower conductive film serving as the base is preferably a (111)-oriented film of a metal that assumes a face-centered cubic crystal structure, such as platinum (Pt), gold (Au), iridium (Ir) or rhodium (Rh).

However, in some cases forming a lower conductive film or functional film or the like requires a high-temperature process at a temperature exceeding 600° C. Since it is necessary in such cases to form the lower conductive film or functional film on a single crystal substrate of silicon (Si) or the like or on a ceramic substrate, when growing the film, a support substrate of silicon single crystal or ceramic or the like becomes a constituent component of this type of electronic device. As such, it is often difficult to integrate such an electronic device on the same substrate as other electronic devices, limiting the product configuration.

SUMMARY OF THE INVENTION

It is therefore an object of the present invention to provide a component for fabricating an electronic device that greatly increases the degree of device configuration freedom, and a method of fabricating the electronic device.

The component for fabricating the electronic device according to the present invention comprises a substrate and a conductive film formed on the substrate, wherein adhesion of the conductive film to the substrate is equal to or less than 0.1 N/cm.

In accordance with the component of the invention, the adhesion of the conductive film to the substrate is weak enough to enable the conductive film to be readily peeled from the substrate. This makes it possible to form an electronic device on a substrate other than the substrate used during film formation, thereby greatly increasing the degree of product configuration freedom. If the adhesion of a lower conductive film on the substrate side is equal to or less than 0.04 N/cm, it becomes particularly easy to peel the conductive film from the substrate.

The conductive film is preferably a metallic film having a single orientation in a (111) plane of a face-centered cubic structure or a (0001) plane of a hexagonal close-packed structure, and the X-ray rocking curve full width at half maximum (FWHM) of the conductive film is preferably equal to or less than 2 degrees. When a functional film is formed on a conductive film having such a high crystallinity, the crystallinity of the functional film is enhanced by lattice matching, making it possible to achieve good device characteristics. Another conductive film may be provided on the functional film.

The method of fabricating an electronic device according to this invention comprises a step of forming at least a conductive film and a functional film, in that order, on a substrate, a step of peeling from the substrate a multilayer that includes the conductive film and the functional film, and a step of mounting the peeled multilayer on another substrate.

In accordance with the method of fabricating an electronic device according to this invention, after forming a multilayer on the substrate, the multilayer is peeled from the substrate and mounted on another substrate, thereby eliminating having to use in the end product the substrate used during film formation. This makes it possible to greatly increase the degree of device configuration freedom. In order to readily accomplish the peeling step, in the film formation step it is preferable for the conductive film to be formed on the substrate with an adhesion that is equal to or less than 0.1 N/cm. To obtain good device characteristics, it is also preferable for the conductive film to be formed with an X-ray rocking curve FWHM that is equal to or less than 2 degrees.

The method preferably further comprises a step of forming another conductive film on the functional film, and a step of patterning the other conductive film after the completion of the film formation step and before the peeling step. By doing this, even after the multilayer has been mounted, it is possible to configure the other conductive film disposed below to be oriented toward the other substrate.

The method preferably further comprises a step of patterning the conductive film following the completion of the mounting step. This enables the lower conductive film to be given the desired configuration.

An acoustic multilayer is preferably provided on the surface of the other substrate. Such provision of the acoustic multilayer improves the characteristics of a film bulk acoustic wave resonator by efficiently reflecting oscillations propagated towards the other substrate.

Thus, in accordance with this invention, it is possible to form an electronic device on another substrate, that is, a different substrate from the one used for forming the conductive film and the like, thereby greatly increasing the degree of device configuration freedom.

BRIEF DESCRIPTION OF THE DRAWINGS

The above and other objects, features and advantages of this invention will become more apparent by reference to the following detailed description of the invention taken in conjunction with the accompanying drawings.

DETAILED DESCRIPTION OF THE EMBODIMENTS

Preferred embodiments of the present invention will now be explained in detail with reference to the drawings.

Figure 1:
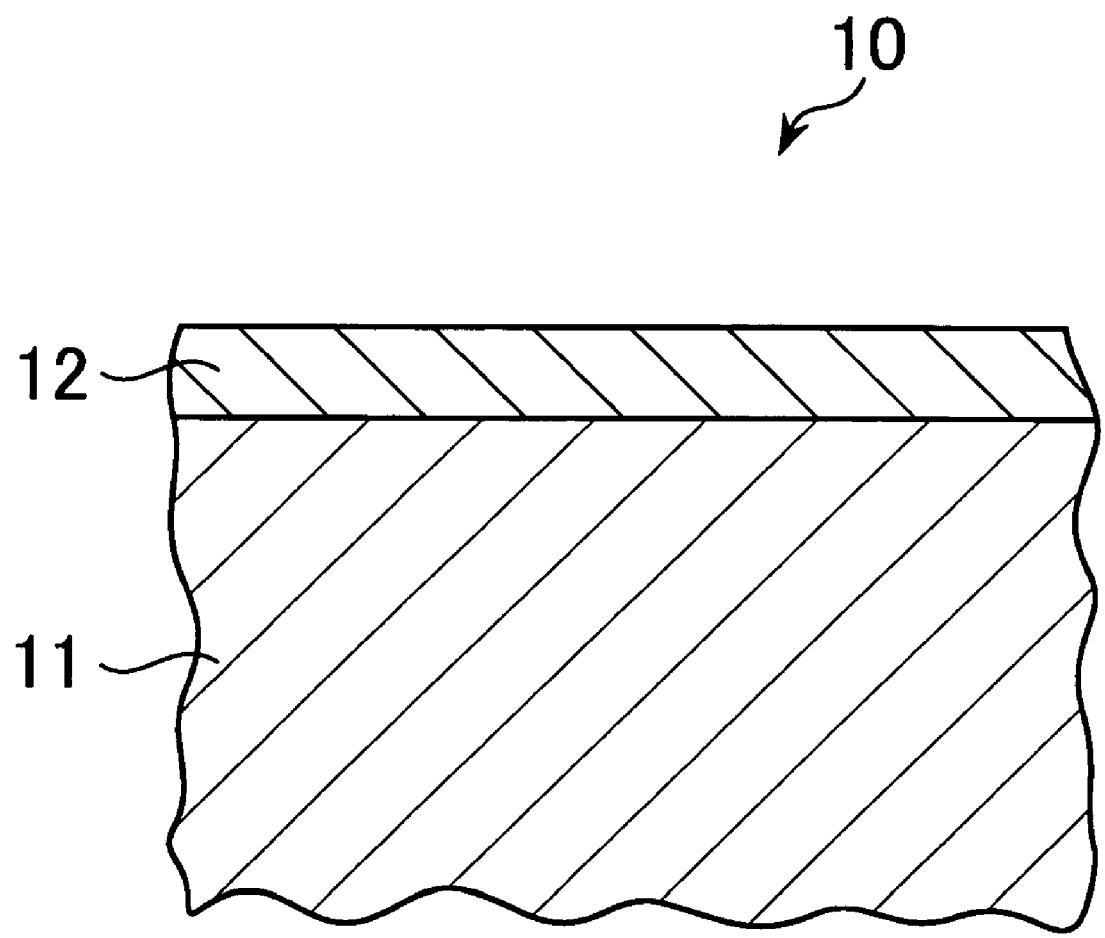
FIG. 1 is a schematic sectional view showing the structure of a component for fabricating an electronic device that is a preferred embodiment of the present invention.

FIG. 1 is a schematic sectional view showing the structure of a component for fabricating an electronic device 10 that is a preferred embodiment of the present invention.

As shown in FIG. 1, the component 10 of this embodiment is constituted of a substrate 11 and a conductive film 12 provided on the substrate 11. Herein, the conductive film 12 is also referred to as "lower conductive film." In this invention, the adhesion of the conductive film 12 to the substrate 11 is equal to or less than 0.1 N/cm, and preferably is equal to or less than 0.04 N/cm. The reason for this is described below. No lower limit is defined for the adhesion; the lower the adhesion, the easier it is to fabricate the electronic device.

The adhesion can be assessed using a tape test, peel test, topping test, scratch test, indentation test or other such adhesion test. Among these, the tape test and peel test are most preferable because they enable easy assessment and measurement of adhesion. When measuring the electronic device of the present invention for adhesion, it is best to use the peel test. Specifically, measurement is conducted in the peel test by first adhering cellophane tape, Kapton tape or other such adhesive tape to the surface of the film attached to the substrate 11 and then slowly peeling of the film vertically while measuring the applied peeling force with a spring scale or the like. The measured force is divided by the tape width to obtain the adhesion per unit width. The adhesion per unit width is equivalent to the adhesion energy between the film and its base at the peeled interface. The term "adhesion" as used in this patent specification and claims means the adhesion energy measured in this manner.

Figure 2:
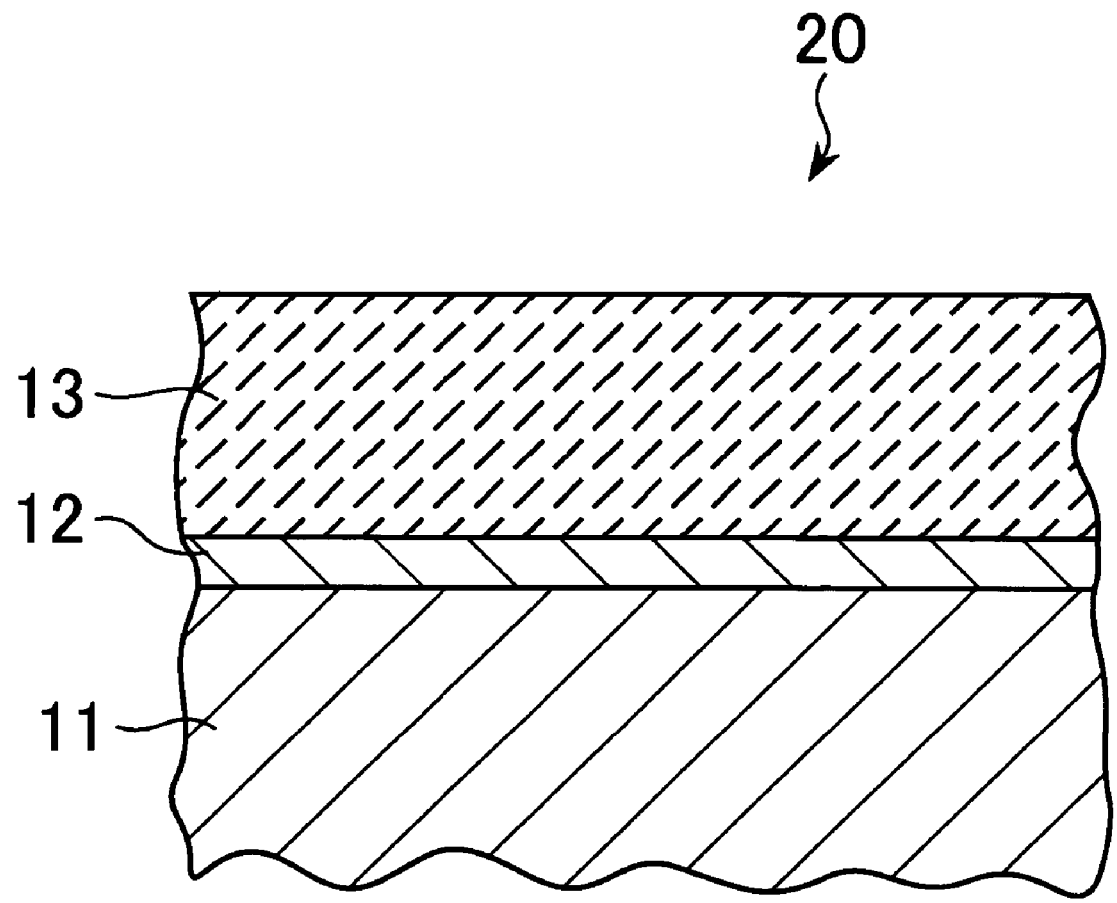
FIG. 2 is a schematic sectional view showing the structure of a component for fabricating an electronic device that is another preferred embodiment of the present invention.

FIG. 2 is a schematic sectional view showing the structure of a component for fabricating an electronic device 20 that is another preferred embodiment of the present invention.

As shown in FIG. 2, the electronic device 20 of this embodiment is constituted of the above component 10 with the addition of a functional film 13 on the conductive film 12. In the case of the component 20 of this embodiment, too, the adhesion of the conductive film 12 to the substrate 11 is equal to or less than 0.1 N/cm, and preferably is equal to or less than 0.04 N/cm.

Figure 3:
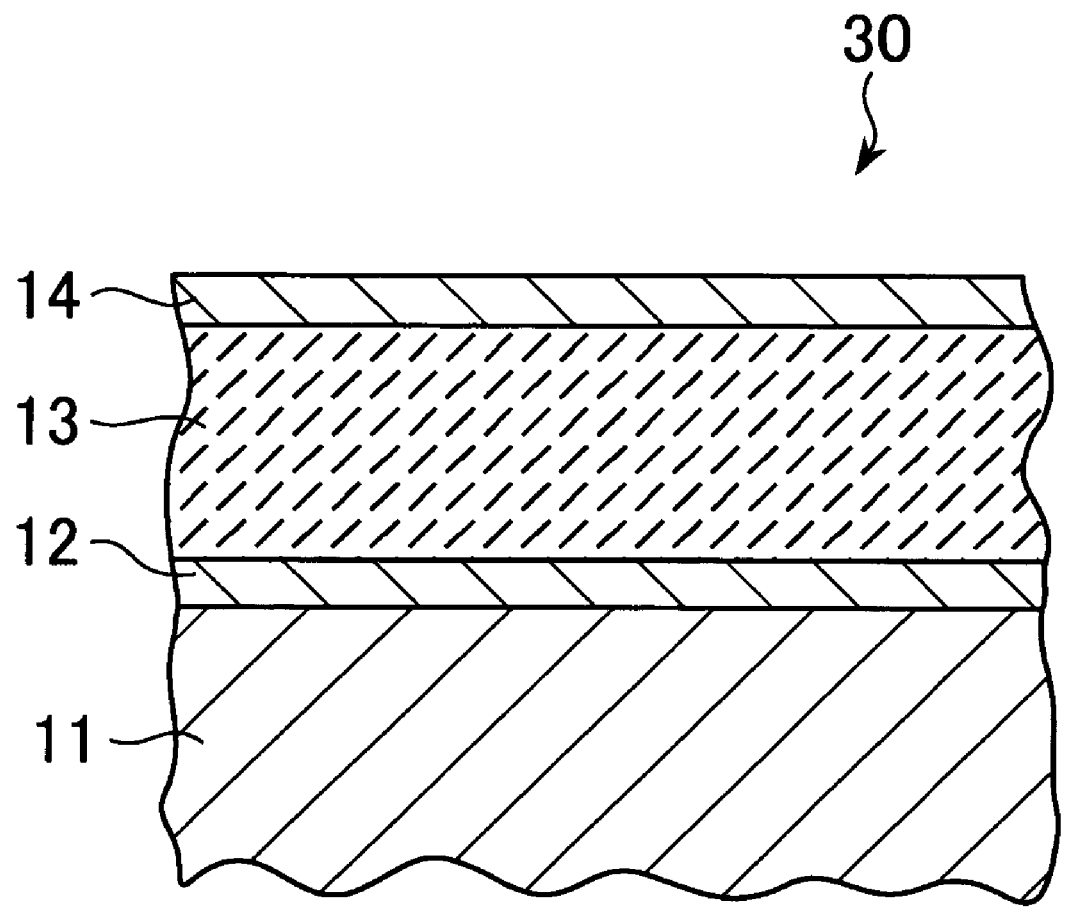
FIG. 3 is a schematic sectional view showing the structure of a component for fabricating an electronic device that is still another preferred embodiment of the present invention.

FIG. 3 is a schematic sectional view showing the structure of a component for fabricating an electronic device 30 that is another preferred embodiment of the present invention.

As shown in FIG. 3, the component 30 of this embodiment is constituted of the above component 20 with the addition of a conductive film 14 on the functional film 13. Herein, the conductive film 14 is also referred to as "upper conductive film." In the component 30 of this embodiment, the adhesion of the conductive film 12 to the substrate 11 is equal to or less than 0.1 N/cm, and preferably is equal to or less than 0.04 N/cm.

The constituent elements of the components 10, 20 and 30 will now be explained in detail.

Substrate 11

As the substrate 11 can be used, for example, a single crystal substrate of silicon (Si), sapphire or the like, a ceramic substrate of alumina, AlTiC or the like, or a quartz or glass substrate. The material of the substrate 11 can be suitably selected taking into account the processes to be used, the desired characteristics of the device, cost and other considerations. For example, when silicon (Si) or glass is used as the material of the substrate 11, an electronic device substrate of low cost can be obtained, while when a high-temperature process conducted at a temperature exceeding 600° C. is required, silicon (Si) or quartz is preferably used. The most preferable material for the substrate 11 is Si single crystal, which is advantageous from the points of low cost and the availability of sophisticated wafer processes.

It is possible to use as the substrate 11 one whose surface has been pre-formed with some kind of film or been subjected to polishing or other such mechanical processing. Most industrial purpose substrates, especially those made of silicon (Si), have been subjected to polishing or other mechanical processing before marketing. On the other hand, some ceramic substrates are pre-formed with a surface film, which itself may be polished, in order to reduce surface roughness. All such substrates are usable in the present invention.

Conductive Film 12 (Lower Conductive Film)

The conductive film 12, that is included in the components 20 and 30 shown in FIGS. 2 and 3, is formed on the underside of the functional film 13 in the device structure. When a piezoelectric material of wurtzite crystal structure such as AlN, ZnO or GaN is used as the material of the functional film 13, the conductive film 12 is preferably a metallic film oriented in the (111) plane of a face-centered cubic structure or the (0001) plane of a hexagonal close-packed structure. The film oriented in the (111) plane of a face-centered cubic structure referred to here is a film wherein the reflection peak intensity in θ-2θ X-ray diffraction of planes other than an (hhh) plane is not greater than 10% of the maximum reflection peak intensity of the (hhh) plane. The symbol (hhh) refers generally to planes represented by assigning h an integral value, such as the (111) and (222) planes.

When the conductive film 12 of face-centered cubic structure (111) orientation or hexagonal close-packed structure (0001) orientation is formed thereon with a functional film 13 composed of a wurtzite structure piezoelectric material such as AlN, ZnO or GaN, it becomes possible to form a functional film 13 having excellent crystallinity by, for example, epitaxial growth.

The crystallinity of the conductive film 12 is preferably such that the X-ray rocking curve FWHM of the face-centered cubic (111) plane reflection or the hexagonal close-packed (0002) plane reflection in X-ray diffraction is not greater than 2 degrees and more preferably not greater than 1.5 degrees.

Figure 4:
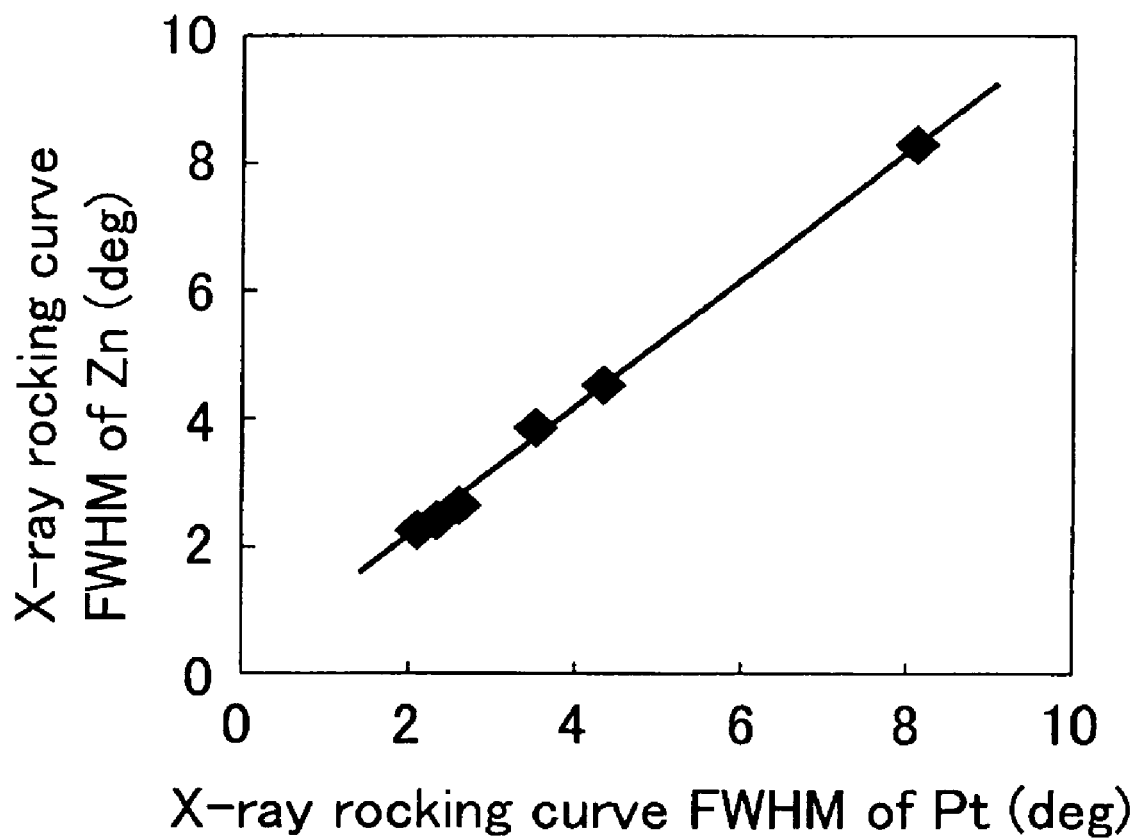
FIG. 4 is a graph showing how the crystallinity of a functional film varies with the crystallinity of a conductive film.

FIG. 4 is a graph showing the relationship between the crystallinity of the conductive film 12 and the crystallinity of the functional film 13, in a case in which a Pt film with (111) single orientation is used as the conductive film 12 and a ZnO film is used as the functional film 13. As shown in FIG. 4, the X-ray rocking curve FWHM of the Pt film and the X-ray rocking curve FWHM of the ZnO exhibit substantially the same values, indicating that the crystallinity of the ZnO improves with the improvement in the crystallinity of the Pt film (as the X-ray rocking curve FWHM thereof decreases) on which the ZnO is formed. When the final product is a film bulk acoustic wave resonator, for example, the crystallinity of the functional film 13 has a major effect on the impedance ratio (the ratio of the resonance impedance and the antiresonance impedance) and on the effective electromechanical coupling factor ($k^2$) of the film bulk acoustic wave resonator, with the impedance ratio and the effective electromechanical coupling factor improving with the improvement in the crystallinity.

The substrate 11 adhesion of the conductive film 12 has to be sufficiently small, since, as described below, the process of fabricating an electronic device using the components 10, 20 or 30 requires peeling at the interface of the substrate 11 and conductive film 12. Thus, the greater the adhesion on the substrate 11 side of the conductive film 12 is, the more difficult it is to carry out the peeling, leading to decreased yields and the like. Therefore, to facilitate peeling, the adhesion of the conductive film 12 to the substrate 11 has to be not greater than 0.1 N/cm, and the peeling is greatly facilitated when the adhesion is not greater than 0.04 N/cm.

The material of the conductive film 12 preferably contains as its main component at least one of platinum (Pt), gold (Au), iridium (Ir), osmium (Os), rhenium (Re), palladium (Pd), rhodium (Rh) and ruthenium (Ru). Platinum (Pt), gold (Au), iridium (Ir), palladium (Pd) and rhodium (Rh) assume a face-centered cubic structure and osmium (Os), rhenium (Re) and ruthenium (Ru) assume a hexagonal close-packed structure. The surfaces of these metals are easy to keep clean and when fouled can be readily cleaned by ashing or heat treatment. A clean surface of the conductive film 12 facilitates the formation of the functional film 13 made of ZnO or other with good crystallinity.

The conductive film 12 is not limited to the foregoing metals, however, and can instead be formed of, for example, a film of body-centered cubic structure metal such as molybdenum (Mo) or tungsten (W) or a film of a perovskite structure oxide conductor such $SrRuO_3$. Since adhesion to the underlying base also varies markedly with the production conditions when any of these materials is used, it is again necessary to establish conditions for ensuring the aforesaid degree of adhesion.

The thickness of the conductive film 12 is preferably 10-1000 nm, more preferably 50-300 nm. This is because the conductive film 12 becomes inappropriate as an electrode owing to large sheet resistance when thinner than 10 nm, while the production process time and material cost become unnecessarily large when it is thicker than 1000 nm. Moreover, when the electronic device of this embodiment is used as a film bulk acoustic wave resonator, its resonant frequency varies with the thickness of the conductive film 12, so that the thickness of the conductive film 12 is preferably set based on the desired resonant frequency.

Functional Film 13

As explained earlier, materials usable for the functional film 13 include piezoelectric materials of wurtzite crystal structure such as ZnO, AlN or GaN and ferroelectric materials such as PZT. When an piezoelectric material such as ZnO is used as the material of the functional film 13, for example, the electronic device can be used as a film bulk acoustic wave resonator, ink-jet printer head or other such electronic device, while if a ferroelectric material such as PZT is used as the functional film 13, the electronic device can be used as a ferroelectric nonvolatile memory, film capacitor or other such electronic device.

As mentioned earlier, the X-ray rocking curve FWHM of the functional film 13 is preferably not greater than 2 degrees, more preferably not greater than 1.5 degrees. The X-ray rocking curve FWHM of the functional film 13 can be controlled to such a value by, as explained earlier, forming the conductive film 12 serving as its base so as to have an X-ray rocking curve FWHM of not greater than 2 degrees, preferably not greater than 1.5 degrees. This enables fabrication of an electronic device having good characteristics.

The thickness of the functional film 13 must be appropriately defined in accordance with the type and required characteristics of the electronic device. When the electronic device is to be used as a film bulk acoustic wave resonator, for example, the thickness of the functional film 13 needs to be set thinner in proportion as the resonant frequency is set higher.

Conductive Film 14 (Upper Conductive Film)

The material of the conductive film 14 is required to be electrically conductive but is otherwise not particularly limited. The conductive film 14 can be formed of a metal such as aluminum (Al), gold (Au) or platinum (Pt), an alloy of these metals and copper (Cu), or the like, or a multilayer film obtained by stacking layers of these metals and titanium (Ti) or the like. The conductive film 14 need not necessarily be a film formed by epitaxial growth. In addition, it is preferable to interpose a protective film between the functional film 13 and the conductive film 14. Silicon oxide ($SiO_2$) or the like can be used as the material of the protective film.

The conductive film 14 is preferably given a thickness of 50 nm-1 µm. This is because electrical discontinuity or other such defect is likely to occur when the thickness of the conductive film 14 is less than 50 nm and the processability of the conductive film 14 becomes exceedingly poor at a thickness greater than 1 µm. When the electronic device according to this embodiment is to be used as a film bulk acoustic wave resonator, its resonant frequency varies with the thickness of the conductive film 14, similarly as it does with the thickness of the conductive film 12. The thickness of the conductive film 14 is therefore preferably defined based on the desired resonant frequency.

The structures of the components 10, 20 and 30 of this embodiment are as described in the foregoing. In the components 10, 20 and 30 of this embodiment, the fact that the adhesion between the conductive film 12 and the substrate 11 on which it is formed is weak makes it possible to peel the conductive film 12 from the substrate 11.

The method of fabricating an electronic device according to the present invention will now be described.

Figure 5:
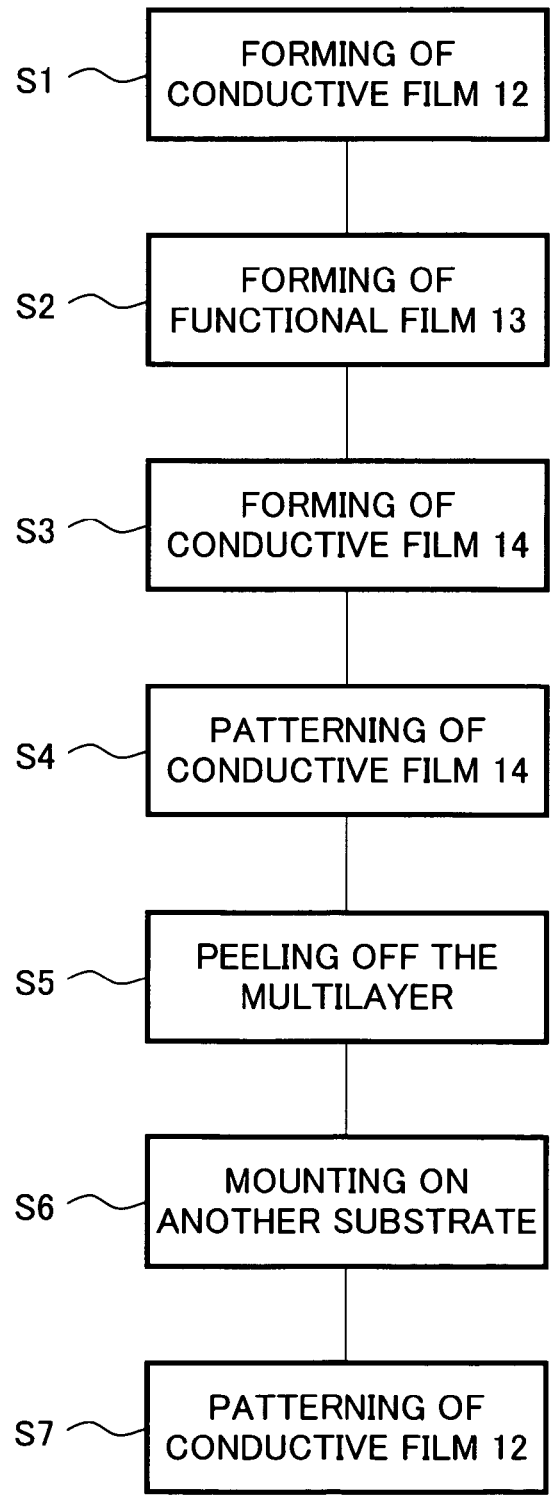
FIG. 5 is a flow chart for explaining the method of fabricating the electronic device according to a preferred embodiment of the invention.

FIG. 5 is a flow chart for explaining the method of fabricating the electronic device according to a preferred embodiment of the invention. In this case, the method is described with reference to the component 30 shown in FIG. 3.

First, a substrate 11 is prepared, and a conductive film 12 (lower conductive film) is formed on the substrate 11 (step S1). Here, the adhesion of the conductive film 12 on the substrate 11 is preferably not greater than 0.1 N/cm, and more preferably is not greater than 0.04 N/cm. Also, the X-ray rocking curve FWHM of the conductive film 12 is preferably not greater than 2 degrees, and more preferably is not greater than 1.5 degrees.

The conductive film 12 is preferably formed by vacuum deposition, sputtering or CVD, with vacuum deposition being particularly preferable, the adhesion between the substrate 11 and conductive film 12 can be decreased by using vacuum deposition. The substrate temperature during formation of the conductive film 12 by vacuum deposition is preferably not higher than 800° C., and more preferably is not higher than 300° C. If the substrate temperature exceeds 800° C., the adhesion of the conductive film 12 to the substrate 11 becomes too high, which not only makes peeling difficult, but also degrades the surface properties of the metallic film constituting the conductive film 12, giving rise to pinholes and the like. If sputtering is used to form the conductive film 12, the adhesion tends to be stronger than when vacuum deposition is used, so a lower substrate temperature has to be set. Specifically, the substrate temperature is preferably set to not more than 200° C., since using a substrate temperature that exceeds 200° C. during the sputtering causes the adhesion of the conductive film 12 to the substrate 11 to be too high, making peeling difficult.

Next, a functional film 13 is formed on the conductive film 12 (step S2). When the functional film 13 is made of a piezoelectric material of wurtzite crystal structure such as AlN or ZnO, it is preferably formed by a sputtering method such as RF magnetron sputtering, DC sputtering or ECR sputtering, or by CVD (chemical vapor deposition), MBE (molecular beam epitaxy) or vacuum deposition. Among these, it is preferable to use a sputtering method, particularly the RF magnetron sputtering method. This is because RF magnetron sputtering enables ready formation of an AlN or ZnO film of high crystallinity with single c-axis orientation. When AlN is used, it is preferable to adopt reactive RF magnetron sputtering. In this case, an excellent AlN film can be formed by using Al metal for the cathode, introducing Ar and nitrogen gas, and conducting the reactive RF magnetron sputtering at a substrate temperature of around 200° C. A film excellent in crystallinity containing very little impurity can also be fabricated when ECR sputtering is used.

When the functional film 13 is made of a ferroelectric material such as PZT, it is preferably formed by vacuum deposition, sputtering, CVD or laser ablation. Vacuum deposition and sputtering are particularly preferable. The vapor deposition method known as reactive vapor deposition is particularly advantageous in enabling fabrication of a ferromagnetic film of high crystallinity and uniform thickness.

Next, the conductive film 14 (upper conductive film) is formed on the functional film 13 (step S3). There is no particular limitation on the method used to form the conductive film 14, which can be formed using vacuum deposition, sputtering or CVD.

This completes the fabrication of the component 30 shown in FIG. 3. In this patent specification and claims, the steps of forming the conductive film and functional film on the substrate 11 (steps S1 to S3) are referred to as "film formation step."

Next, the conductive film 14 (upper conductive film) is patterned in a prescribed configuration (step S4). As the patterning method, a resist having the prescribed pattern may be formed on the surface of the conductive film 14 and used as a mask for forming the pattern using ion milling or other such etching technique. The configuration of the patterning formed on the conductive film 14 may be determined in accordance with the desired characteristics, based on the use of the patterned conductive film 14 as an electrode in the film bulk acoustic wave resonator constituting the end product. Accordingly, the patterning of the conductive film 14 may be any patterning that provides the desired characteristics, so further details of the patterning are omitted herein.

Next, the multilayer constituted by the conductive film 12, functional film 13 and patterned conductive film 14 is peeled from the substrate 11 (step S5). This peeling is preferably carried out using an adhesive jig, film or tape. The multilayer can also be separated by removing the substrate 11 using etching or the like.

Next, the peeled multilayer is mounted on another substrate, with the patterned conductive film 14 facing the other substrate (step S6). The other substrate can be constituted of the same material as that of the substrate 11, that is, it can be a single crystal substrate of silicon (Si) or sapphire or the like, a ceramic substrate of alumina, AlTiC or the like, a substrate of quartz or glass or the like, a circuit substrate on which coils, capacitors and other such electronic devices are formed or mounted, a plastic substrate, a housing for various types of electronic devices or other such substrate having a prescribed mechanical strength. The part-count of the end product can be reduced by using a circuit substrate on which other electronic devices are formed to constitute the other substrate.

When the end product is a film bulk acoustic wave resonator, it is preferable to form an acoustic multilayer on the patterned conductive film 14 prior to mounting the above multilayer on the other substrate, or to use, as the other substrate, a substrate on the surface of which an acoustic multilayer is provided.

Figure 6:
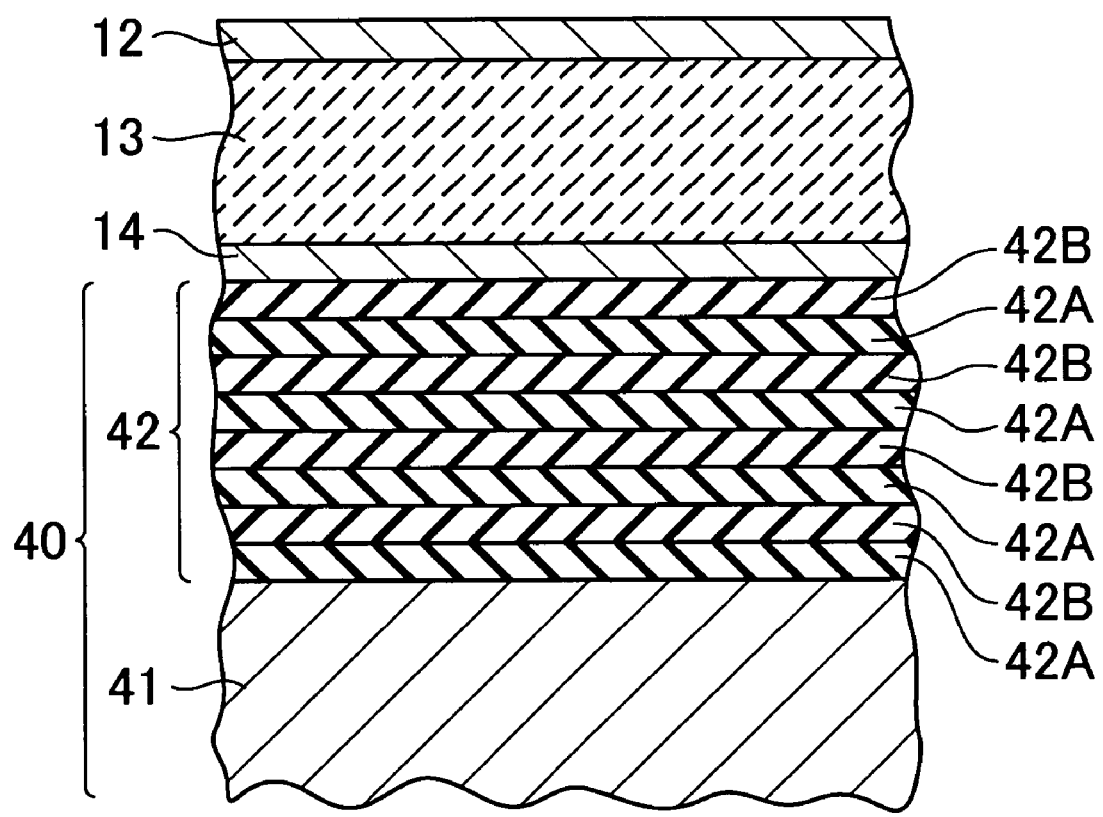
FIG. 6 is a schematic sectional view showing the multilayer mounted on a substrate on which an acoustic multilayer has been formed.

FIG. 6 is a schematic sectional view showing the multilayer mounted on a substrate 40 on which an acoustic multilayer has been formed.

As shown in FIG. 6, the substrate 40 is constituted of a substrate body 41 and an acoustic multilayer 42 formed on the surface of the substrate body 41. As the substrate body 41 can be used, for example, a single crystal substrate of silicon (Si), sapphire or the like, a ceramic substrate of alumina, AlTiC or the like, or a quartz or glass substrate. The acoustic multilayer 42 is constituted of alternately stacked reflective films 42A and 42B made of different material from each other. These layers enhance the characteristics of the film bulk acoustic wave resonator by reflecting vibration propagating toward the substrate body 41. The material used for the reflective films 42A can, for example, be aluminum nitride (AlN) and the material used for the reflective films 42B can, for example, be silicon oxide ($SiO_2$). When made of aluminum nitride (AlN), the reflective films 42A are preferably formed by sputtering. When made of silicon oxide ($SiO_2$), the reflective films 42B are preferably formed by CVD. The thickness of the reflective films 42A and 42B can be defined as appropriate for the desired resonant frequency.

After the multilayer is thus mounted on another substrate, the conductive film 12 (lower conductive film) is patterned in a prescribed configuration (step S7). As in the case of the conductive film 14, the patterning may be done by forming a resist with the prescribed patterning on the surface of the conductive film 12 and using the resist as a mask for forming the pattern by ion milling or other such etching technique. The configuration of the patterning formed on the conductive film 12 may be determined in accordance with the desired characteristics, based on the use of the patterned conductive film 12 as an electrode in the end-product film bulk acoustic wave resonator. Accordingly, the patterning of the conductive film 14 may be any patterning that provides the desired characteristics, so further details of the patterning are omitted herein.

This completes the electronic device. When a piezoelectric material such as ZnO is used as the material of the functional film 13, the electronic device can be used as a film bulk acoustic wave resonator or ink-jet printer head or the like, while when a ferroelectric material such as PZT is used for the functional film 13, the electronic device can be used as a ferroelectric nonvolatile memory or film capacitor or the like. Moreover, such an electronic device can be combined with other circuitry to configure various electronic devices such as high-frequency filters, duplexers, and integrated semiconductor circuits with built-in RF sections for telecommunication applications.

In accordance with the method of fabricating an electronic device according to this embodiment, after forming on the substrate a multilayer constituted by the conductive film 12, functional film 13 and conductive film 14, the multilayer is peeled from the substrate and mounted on another substrate, thereby eliminating having to use the film-formation substrate in the end product. Thus, the degree of device configuration freedom is greatly increased.

The present invention has thus been shown and described with reference to specific embodiments. However, it should be noted that the present invention is in no way limited to the details of the described arrangements but changes and modifications may be made without departing from the scope of the appended claims.

For example, although the flow chart of FIG. 5 relates to the fabrication of an end device using the component 30 shown in FIG. 3, it can also be used to fabricate an electronic device by fabricating the component 20 of FIG. 2 and then peeling off the multilayer comprised of the conductive film 12 and functional film 13 and mounting the multilayer on another substrate, or to fabricate an electronic device by fabricating the component 10 of FIG. 1 and then peeling off the conductive film 12 and mounting it on another substrate.

Again, although the flow chart of FIG. 5 describes the forming of the conductive film 14 (step S3) being followed by the patterning thereof (step S4), the patterning step may be omitted by using a metallic mask or the like to form the conductive film 14. However, a metallic mask or the like should not be used to selectively form the conductive film 12, because if the conductive film 12 is selectively formed, there will be contact between the substrate 11 and functional film 13 in the regions in which the conductive film 12 is not formed, the adhesion of which will make peeling difficult.

In the above embodiments, the multilayer is mounted on the other substrate with the conductive film 14 on the substrate side (step S6), but when it is not necessary to pattern the conductive film 12, the multilayer may be mounted with the conductive film 12 facing the other substrate.

WORKING EXAMPLES AND COMPARATIVE EXAMPLES

Here follows a description of working examples of the present invention, but the present invention is in no way limited to these examples.

Example 1

In Example 1, a plurality of components for fabricating electronic devices having the structure of the component 30 shown in FIG. 3 were fabricated by the following method.

First, a substrate 11 was prepared from 3-inch-diameter wafer of single crystal silicon with a thermal oxidation film, and a 100 nm thick conductive film 12 of platinum (Pt) was formed on the substrate surface. A substrate temperature of 23° C. was used to form the conductive film 12, using vacuum deposition.

Next, an 1 μm thick functional film 13 composed of ZnO was formed on the lower conductive film 12 by RF magnetron sputtering.

Sputtering was then used to form a 300 nm thick conductive film 14 of aluminum (Al) on the functional film 13, thereby completing fabrication of the plurality of components in Example 1.

The adhesion between the conductive film 12 and the substrate 11 in the components thus fabricated was measured by conducting a peel test, and was found to be 0.005 N/cm. A peel test was then carried out on the test samples of Example 1 by adhering ultraviolet curable dicing tape used in a normal silicon process, and peeling the tape together with the multilayer from the substrate, which showed that peeling could be correctly performed with respect to all the components.

Example 2

In Example 2, a plurality of components were fabricated in the same manner as in Example 1, except that the substrate temperature during formation of the conductive film 12 was set at 200° C.

The adhesion between the conductive film 12 and the substrate 11 in the components thus fabricated was measured by conducting a peel test, and found to be 0.025 N/cm. A peel test that was then carried out using ultraviolet curable dicing tape in which the tape together with the multilayer was peeled from the substrate, showed that peeling could be correctly performed with respect to all the components.

Example 3

In Example 3, a plurality of components were fabricated in the same manner as in Example 1, except that the substrate temperature during formation of the conductive film 12 was set at 300° C.

The adhesion between the conductive film 12 and the substrate 11 in the e components thus fabricated was measured by conducting a peel test, and found to be 0.039 N/cm. A peel test that was then carried out using ultraviolet curable dicing tape in which the tape together with the multilayer was peeled from the substrate, showed that peeling could be correctly performed with respect to all the components.

Example 4

In Example 4, a plurality of components were fabricated in the same manner as in Example 1, except that the conductive film 12 is formed by spattering at a substrate temperature of 100° C.

The adhesion between the conductive film 12 and the substrate 11 in the components thus fabricated was measured by conducting a peel test, and found to be 0.050 N/cm. The result of a peel test that was then carried out using ultraviolet curable dicing tape in which the tape together with the multilayer was peeled from the substrate, was that although peeling could not be correctly performed with respect to some of the components, peeling could be correctly performed with respect to 90% or more of the components.

Example 5

In Example 5, a plurality of components were fabricated in the same manner as in Example 1, except that the substrate temperature during formation of the conductive film 12 was set at 400° C.

The adhesion between the conductive film 12 and the substrate 11 in the components thus fabricated was measured by conducting a peel test, and found to be 0.052 N/cm. The result of a peel test that was then carried out using ultraviolet curable dicing tape in which the tape together with the multilayer was peeled from the substrate, was that although peeling could not be correctly performed with respect to some of the components, peeling could be correctly performed with respect to 90% or more of the components.

Example 6

In Example 6, a plurality of components were fabricated in the same manner as in Example 1, except that the substrate temperature during formation of the conductive film 12 was set at 500° C.

The adhesion between the conductive film 12 and the substrate 11 in the components thus fabricated was measured by conducting a peel test, and found to be 0.058 N/cm. The result of a peel test that was then carried out using ultraviolet curable dicing tape in which the tape together with the multilayer was peeled from the substrate, was that although peeling could not be correctly performed with respect to some of the components, peeling could be correctly performed with respect to 90% or more of the components.

Example 7

In Example 7, a plurality of components were fabricated in the same manner as in Example 1, except that the substrate temperature during formation of the conductive film 12 was set at 600° C.

The adhesion between the conductive film 12 and the substrate 11 in the components thus fabricated was measured by conducting a peel test, and found to be 0.064 N/cm. The result of a peel test that was then carried out using ultraviolet curable dicing tape in which the tape together with the multilayer was peeled from the substrate, was that although peeling could not be correctly performed with respect to some of the components, peeling could be correctly performed with respect to 90% or more of the components.

Example 8

In Example 8, a plurality of components were fabricated in the same manner as in Example 1, except that the substrate temperature during formation of the conductive film 12 was set at 700° C.

The adhesion between the conductive film 12 and the substrate 11 in the components thus fabricated was measured by conducting a peel test, and found to be 0.081 N/cm. The result of a peel test that was then carried out using ultraviolet curable dicing tape in which the tape together with the multilayer was peeled from the substrate, was that although peeling could not be correctly performed with respect to some of the components, peeling could be correctly performed with respect to 90% or more of the components.

Example 9

In Example 9, a plurality of components were fabricated in the same manner as in Example 1, except that the conductive film 12 is formed by spattering at a substrate temperature of 200° C.

The adhesion between the conductive film 12 and the substrate 11 in the components thus fabricated was measured by conducting a peel test, and found to be 0.090 N/cm. The result of a peel test that was then carried out using ultraviolet curable dicing tape in which the tape together with the multilayer was peeled from the substrate, was that although peeling could not be correctly performed with respect to some of the components, peeling could be correctly performed with respect to 90% or more of the components.

Example 10

In Example 10, a plurality of components s were fabricated in the same manner as in Example 1, except that the substrate temperature during formation of the conductive film 12 was set at 800° C.

The adhesion between the conductive film 12 and the substrate 11 in the components thus fabricated was measured by conducting a peel test, and found to be 0.092 N/cm. The result of a peel test that was then carried out using ultraviolet curable dicing tape in which the tape together with the multilayer was peeled from the substrate, was that although peeling could not be correctly performed with respect to some of the components, peeling could be correctly performed with respect to 90% or more of the components.

Comparative Example 1

In Comparative Example 1, a plurality of components were fabricated in the same manner as in Example 1, except that the conductive film 12 is formed by spattering at a substrate temperature of 300° C.

The adhesion between the conductive film 12 and the substrate 11 in the components thus fabricated was measured by conducting a peel test, and found to be 0.12 N/cm. The result of a peel test that was then carried out using ultraviolet curable dicing tape in which the multilayer was peeled from the substrate, was that proper peeling took place with respect to from 70% to less than 90% of the components.

Comparative Example 2

In Comparative Example 2, a plurality of components were fabricated in the same manner as in Example 1, except that the conductive film 12 is formed by spattering at a substrate temperature of 350° C.

The adhesion between the conductive film 12 and the substrate 11 in the components thus fabricated was measured by conducting a peel test, and found to be 0.35 N/cm. The result of a peel test that was then carried out using ultraviolet curable dicing tape in which the multilayer was peeled from the substrate, was that proper peeling took place with respect to from 70% to less than 90% of the components.

Comparative Example 3

In Comparative Example 3, a plurality of components were fabricated in the same manner as in Example 1, except that the conductive film 12 is formed by spattering at a substrate temperature of 400° C.

The adhesion between the conductive film 12 and the substrate 11 in the components thus fabricated was measured by conducting a peel test, and found to be 1.30 N/cm. The result of a peel test that was then carried out using ultraviolet curable dicing tape in which the multilayer was peeled from the substrate, was that proper peeling took place with respect to less than 70% of the components.

Comparative Example 4

In Comparative Example 4, a plurality of components were fabricated in the same manner as in Example 1, except that the conductive film 12 is formed by spattering at a substrate temperature of 450° C.

The adhesion between the conductive film 12 and the substrate 11 in the components thus fabricated was measured by conducting a peel test, and found to be 2.15 N/cm. The result of a peel test that was then carried out using ultraviolet curable dicing tape in which the multilayer was peeled from the substrate, was that proper peeling took place with respect to less than 70% of the components.

The evaluation results obtained for the components of Examples 1 to 10 and Comparative Examples 1 to 4 are summarized in Table 1.

Next, an 800 nm thick functional film 13 composed of ZnO was formed on the conductive film 12 by RF magnetron sputtering.

Then, CVD was used to form a 50 nm thick $SiO_2$ film on the functional film 13 as a protective layer, and a conductive film 14 composed of aluminum (Al) was formed on the protective layer by sputtering. The conductive film 14 was then patterned by photolithography.

This completed the component for fabricating the electronic device. The component thus fabricated was given an X-ray diffraction test, which revealed that the conductive film 12 had a face-centered cubic (111) orientation and an X-ray rocking curve FWHM of 1.2 degrees. The ZnO film constituting the functional film 13 was found to have an (0001) orientation and, based on the fact that the ZnO (0002) X-ray rocking curve FWHM was 2.5 degrees, was found to be a film of high crystallinity.

Next, dicing tape was used to peel the multilayer comprised of the conductive film 12, the functional film 13 and the patterned conductive film 14 from the substrate 11, and an adhesive was used to mount the multilayer on a plastic substrate on which an acoustic multilayer was formed by repeating four cycles of a process in which a 1.5 μm thick AlN film

TABLE 1

|  | ADHESION (N/cm) | FORMING METHOD | FORMING TEMPERATURE (° C.) | PROBABILITY OF PEELING |
|---|---|---|---|---|
| EXAMPLE 1 | 0.005 | VACUUM DEPOSITION | 23 | ⊚ |
| EXAMPLE 2 | 0.025 | VACUUM DEPOSITION | 200 | ⊚ |
| EXAMPLE 3 | 0.039 | VACUUM DEPOSITION | 300 | ⊚ |
| EXAMPLE 4 | 0.052 | SPATTERING | 100 | ○ |
| EXAMPLE 5 | 0.052 | VACUUM DEPOSITION | 400 | ○ |
| EXAMPLE 6 | 0.058 | VACUUM DEPOSITION | 500 | ○ |
| EXAMPLE 7 | 0.064 | VACUUM DEPOSITION | 600 | ○ |
| EXAMPLE 8 | 0.081 | VACUUM DEPOSITION | 700 | ○ |
| EXAMPLE 9 | 0.086 | SPATTERING | 200 | ○ |
| EXAMPLE 10 | 0.092 | VACUUM DEPOSITION | 800 | ○ |
| COMPARATIVE EXAMPLE 1 | 0.12 | SPATTERING | 300 | Δ |
| COMPARATIVE EXAMPLE 2 | 0.35 | SPATTERING | 350 | Δ |
| COMPARATIVE EXAMPLE 3 | 1.30 | SPATTERING | 400 | X |
| COMPARATIVE EXAMPLE 4 | 2.15 | SPATTERING | 450 | X |

⊚: CORRECTLY PERFORMED WITH RESPECT TO 100%
○: CORRECTLY PERFORMED WITH RESPECT TO FROM 90% TO LESS THAN 100%
Δ: CORRECTLY PERFORMED WITH RESPECT TO FROM 70% TO LESS THAN 90%
X: CORRECTLY PERFORMED WITH RESPECT TO LESS THAN 70%

As shown in Table 1, in the case of Examples 1 to 10 in which the adhesion between the substrate 11 and the conductive film 12 was not greater than 0.1 N/cm, the probability of peeling being performed correctly was confirmed to be 90% or higher, and in the case of Examples 1 to 3 in which the adhesion was not greater than 0.04 N/cm, peeling could be correctly performed with respect to all of the components.

Example 11

A substrate 11 was prepared composed of single crystal silicon on which a surface thermal oxidation film was formed, and a conductive film 12 of 150 nm thick platinum (Pt) was formed on the surface thereof by vacuum deposition. The substrate temperature during formation was set at 500° C., and the film-forming rate at 0.06 nm/s.

and an 0.8 μm thick $SiO_2$ film were overlaid in that order (see FIG. 6). The multilayer was mounted with the patterned conductive film 14 toward the plastic substrate side.

Next, the conductive film 12 was patterned, completing the fabrication of the electronic device (film bulk acoustic wave resonator).

Measurement of the characteristics of the electronic device (film bulk acoustic wave resonator) showed it to have excellent resonance characteristics, namely, a resonant frequency fr of 2.0 GHz, an antiresonant frequency fa of 2.06 GHz, an effective electromechanical coupling factor $(fa^2-fr^2)/fr^2$ of 5.5%, and a resonance antiresonance impedance ratio of 50 dB.

A bandpass filter fabricated by combining the electronic device thus fabricated with an electronic device fabricated by

What is claimed is:

1. A component for fabricating an electronic device comprising a substrate, a conductive film formed on a surface of the substrate and a functional film formed on the conductive film, wherein adhesion of the conductive film to the substrate is equal to or less than 0.1 N/cm, wherein the functional film includes at least one of a piezoelectric material and a ferroelectric material, and wherein said conductive film is a metallic film having one of a single orientation in a (111) plane of a face-centered cubic structure and a single orientation in a (0001) plane of a hexagonal close-packed structure.

2. The component for fabricating the electronic device as claimed in claim 1, wherein said adhesion is equal to or less than 0.04 N/cm.

3. The component for fabricating the electronic device as claimed in claim 1, wherein an X-ray rocking curve full width at half maximum of the conductive film is equal to or less than 2 degrees.

4. The component for fabricating the electronic device as claimed in claim 1, farther comprising another conductive film formed on the functional film.

* * * * *